United States Patent [19]

Wagner

[11] Patent Number: 4,498,176
[45] Date of Patent: Feb. 5, 1985

[54] METHOD AND APPARATUS FOR THE ERROR-FREE SYNCHRONIZATION OF ASYNCHRONOUS PULSES

[75] Inventor: Wolfgang Wagner, Munich, Fed. Rep. of Germany

[73] Assignee: Siemens Aktiengesellschaft, Berlin and Munich, Fed. Rep. of Germany

[21] Appl. No.: 347,787

[22] Filed: Feb. 11, 1982

[30] Foreign Application Priority Data

Feb. 19, 1981 [DE] Fed. Rep. of Germany ....... 3106183

[51] Int. Cl.³ .......................... H03K 3/295; H03K 5/13
[52] U.S. Cl. ...................................... 371/47; 307/269; 307/480
[58] Field of Search .................. 371/47; 307/269, 480; 375/106, 118; 328/63

[56] References Cited

U.S. PATENT DOCUMENTS

| | | | |
|---|---|---|---|
| 3,947,697 | 3/1976 | Archer | 307/269 X |
| 3,953,744 | 4/1976 | Kawagoe | 328/63 X |
| 4,093,878 | 6/1978 | Paschal et al. | 307/247 R |
| 4,128,201 | 12/1978 | Barron et al. | 307/527 |

OTHER PUBLICATIONS

Halbleiter–Schaltungstechnik, 1980, p. 514.
Introduction to VLSI–Systems, 1980, pp. 236–242.
IEEE Transactions on Computers, Feb. 1976, pp. 133–139.

Primary Examiner—Jerry Smith
Assistant Examiner—Clark A. Jablon
Attorney, Agent, or Firm—Herbert L. Lerner; Laurence A. Greenberg

[57] ABSTRACT

Method and apparatus for the error-free synchronization of asynchronous pulses through logical interconnection of the asynchronous pulses with clock pulses of constant frequency by means of a flip-flop, which includes comparing output voltages of the flip-flop with a predetermined threshold voltage for determining a metastable state of the flip-flop, and flipping the flip-flop into a third stable state until the next clock pulse appears if a metastable state is present, for preventing an evaluation of the output voltages of the flip-flop.

8 Claims, 3 Drawing Figures

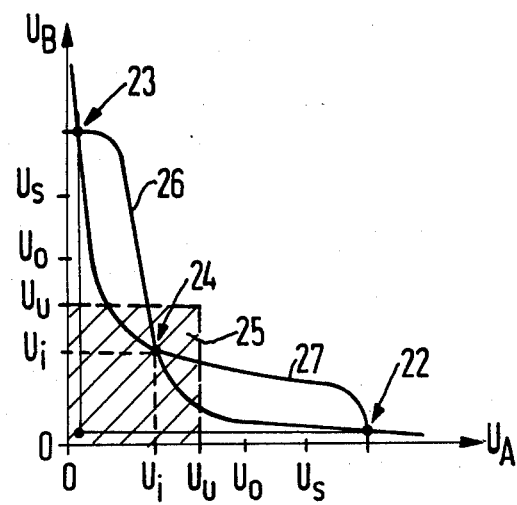
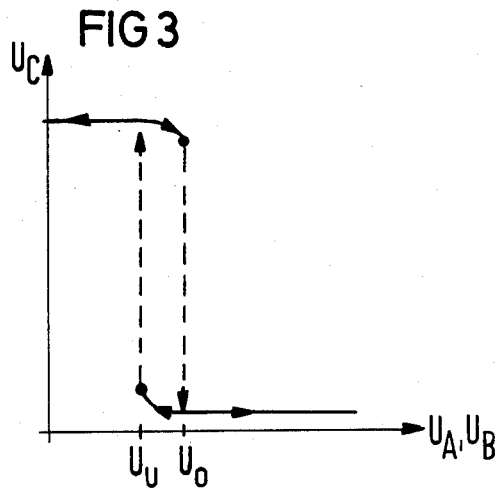

METHOD AND APPARATUS FOR THE ERROR-FREE SYNCHRONIZATION OF ASYNCHRONOUS PULSES

The invention relates to a method and apparatus for the error-free synchronization of asynchronous pulses, by logical interconnection of asynchronous pulses with clock pulses of constant frequency, by means of a flip-flop.

Such methods in which the signal to be synchronized is to be connected to the D-input, for instance, and the system clock frequency $\emptyset$ is to be connected to C-input of a one-edge triggered D-flip-flop, are known from the book by U. Tietze and Ch.Schenk, entitled Halbleiter-Schaltungstechnik, (Semiconductor Circuit Design), 5th edition, 1980, page 514.

If the edges of the signal to be synchronized (which is as a rule asynchronous) are situated timewise in vicinity of the triggering clock edge, it is possible that the flip-flop will not flip completely into one of the stable states, and then will remain in an unstable state for an extended period of time. This can lead to errors in the evaluation of the flip-flop outputs after the occurrence of the triggering clock frequency edge. It has been attempted, as is known, for instance, from the publication by C. Mead and L. Conway, entitled Introductions to VLSI-Systems, Reading, Mass.: Addison-Wesley, 1980, pages 236–242, and particularly page 239, to solve this problem by ignoring the synchronized signal present at the flip-flop for a certain period of time $t_s$ after the synchronizing clock frequency edge. The probability that the unstable state will be maintained longer than $t_s$ decreases exponentially with increasing time t.

Without considering noise, because of which even lower probabilities are achieved, we have for the probability W:

$$W = e^{-kt_s},$$

where k is constant.

By appropriate choice of $t_s$, the error probability can therefore be reduced to a tolerable degree. Because of the negative influence of the waiting time $t_s$ on the processing speed (the waiting time $t_s$ is to be added, such as in microcomputer applications, to the memory speed), a compromise must be made between speed and reliability, which is basically undesirable.

As is known from the article by M. Pěchouček, entitled Anomalous Response Times of Input Synchronizers, IEEE Transactions on Computers, February 1976, pages 133–139, the problem can also be solved by the provision of the clock generator, which provides the system clock, being stopped for a time corresponding to the maximum duration of a metastable state, if a metastable state occurs. If quartz oscillators are used, such a procedure however, is not applicable and therefore inaccurate. Such a procedure is particularly unsuitable for applications in dynamic systems which must maintain certain switching times.

It is accordingly an object of the invention to provide a method and apparatus for the error-free synchronization of asynchronous pulses which overcomes the hereinbefore-mentioned disadvantages of the heretofore-known methods and devices of this general type, and to make available a method for the fast and reliable synchronization of asynchronous signals.

With the foregoing and other objects in view there is provided, in accordance with the invention, a method for the error-free synchronization of asynchronous pulses through logical interconnection of the asynchronous pulses with clock pulses of constant frequency. A flip-flop circuit is used, which combines the comparing output voltages of the flip-flop with a predetermined threshold voltage for determining a metastable state of the flip-flop, and flipping, raising or inclining the flip-flop into a third stable state during which its inputs are inhibited until the next clock pulse appears if a metastable state is present, for preventing an evaluation of the output voltages of the flip-flop. In this manner it is possible to ascertain whether or not the flip-flop operates in a metastable range around the unstable point of the flip-flop in which a decision cannot be easily made, and possibly to prevent an evaluation of the flip-flop outputs until the occurrence of the next synchronizing clock edge.

In accordance with the device of the invention, there is provided an apparatus for carrying out a method for the error-free synchronization of asynchronous pulses, comprising a flip-flop being addressed by the asynchronous pulses, being controlled by clock pulses and having output gates, the output gates having inputs and outputs, the outputs of the output gates of the flip-flop supplying a synchronized signal, a Schmitt-trigger gate having inputs and an output, each input of the Schmitt-trigger gate being connected to a respective one of the outputs of the output gates of the flip-flop, and the output of the Schmitt-trigger gate being connected to the input side of the output gates of the flop-flop for addressing.

In accordance with another feature of the invention, there is provided a slave flip-flop connected to the outputs of the output gates of the first-mentioned flip-flop.

In accordance with a further feature of the invention, the output gates of the flip-flop are NOR gates.

In accordance with an added feature of the invention, the Schmitt-trigger gate has a further input being addressed by the clock pulses.

In accordance with an additional feature of the invention, the Schmitt-trigger gate is a NOR gate.

In accordance with yet another feature of the invention, the flip-flop has an unstable point, and the Schmitt-trigger gate has a lower threshold being above the so-called unstable point.

In accordance with a concomitant feature of the invention, the Schmitt-trigger gate has an upper trigger threshold, and the slave flip-flop has a threshold voltage being above the upper trigger threshold.

Other features which are considered as characteristic for the invention are set forth in the appended claims.

Although the invention is illustrated and described herein as embodied in a method and apparatus for the error-free synchronization of asynchronous pulses, it is nevertheless not intended to be limited to the details shown, since various modifications and structural changes made be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 2 is a graphical illustration showing the characteristics of a master flip-flop used in the circuit diagram of FIG. 1; and FIG. 3 is another graph showing the characteristic of the Schmitt-trigger gate used in the embodiment according to FIG. 1.

Figure 1:
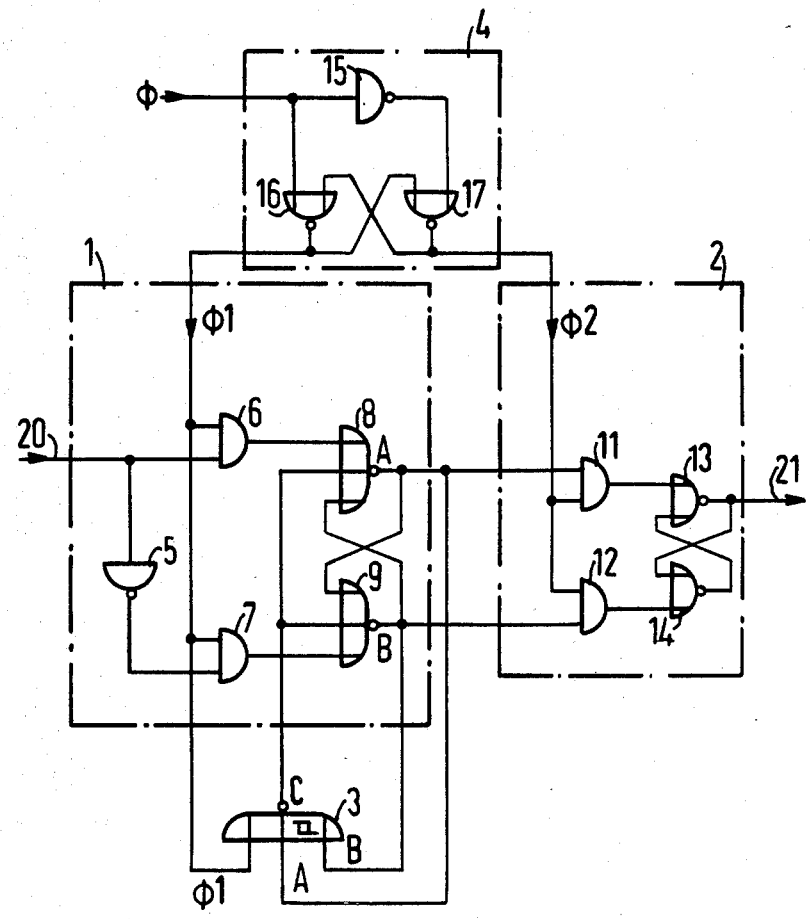
FIG. 1 is a schematic circuit diagram of an embodiment of a device for implementing the method according to the invention.

Referring now to the figures of the drawing and first particularly to FIG. 1 thereof, it is seen that a master-slave flip-flop is used for synchronization in a known manner. The master-slave flip-flop includes a master flip-flop 1 controlled by a clock frequency $\emptyset_1$, and a slave flip-flop 2 controlled by a clock frequency $\emptyset_2$. The two clock frequencies $\emptyset_1$ and $\emptyset_2$ which are required by the master-slave flip-flop and which do not overlap can, for instance, be generated by means of a circuit 4 from a single system-clock frequency. The circuit 4 can be constructed for instance, in such a way that a system clock frequency $\emptyset$ on one hand feeds a NOR gate 16, and on the other hand after it is inverted by an inverter 15, feeds a second NOR gate 17. The output of the NOR gate 16 is connected to the second input of the NOR gate 17, and the output of the NOR gate 17 is connected to the second input of the NOR gate 16. The clock frequency $\emptyset_1$ can then be taken off at the output of the gate 16 and the clock frequency $\emptyset_2$ can be taken off at the output of the gate 17.

In the embodiment example shown, the master flip-flop 1 includes input gates 6, 7 and feed-back output gates 8, 9. The asynchronous input signal 20 which is to be synchronized, on one hand is fed directly to the first input of the AND gate 6, the second input of which is addressed by the clock frequency $\emptyset_1$, and on the other hand the signal 20 is fed after being inverted by an inverter 5, to the first input of an AND gate 7, the second input of which is likewise driven by the clock frequency $\emptyset_1$. The output of the AND gate 6 is connected to one input of the NOR gate 8, and the output of the AND gate 7 is fed to an input of the NOR gate 9. The two NOR gates 8 and 9 are fed back in such a way that the output A of the gate 8 is connected to a further input of the gate 9, and the output B of the gate 9 is connected to a further input of the gate 8.

The slave flip-flop 2 includes two AND gates 11 and 12 which are addressed on the input sides thereof by the clock frequency $\emptyset_2$. The second input of the gate 11 is connected to the output A of the NOR gate 8, and the second input of the gate 12 is connected to the output B of the NOR gate 9. On the output sides of the gates 11, 12, the gate 11 is connected to a first input of a NOR gate 13, and the gate 12 is connected to a first input of a NOR gate 14. The two gates 13 and 14 are fed back in a manner corresponding to the circuit of the gates 8 and 9. The synchronized signal 21 can be taken off at the output of the gate 13.

To allow the implementation of the method according to the invention, the above-described synchronizing circuit is expanded by a Schmitt-trigger gate 3. The first input A of the Schmitt-trigger gate 3, which is in the form of a NOR gate, is connected to the output A of the output gate 8 of the master flip-flop 1; the second input B is connected to the output B of the output gate 9 of the master flip-flop 1; and the third input is connected to the clock frequency $\emptyset_1$. The output of the Schmitt-trigger gate 3 is an inhibit signal and is connected on the one hand to a third input of the gate 8, and on the other hand to a third input of the gate 9.

Through the use of this circuit arrangement it is possible to avoid errors which can occur due to the unstable state of the flip-flop 1, since the unstable state is recognized and leads to an inhibition of the evaluation of the flip-flop outputs A and B. Since an exact detection of the unstable state can only be carried out with a great amount of technical expenditure, the so-called "unwilling to make decisions" range or metastable range around the unstable point, is recognized by performing a comparison of the flip-flop outputs A and B with the lower trigger threshold of the Schmitt-trigger gate 3, and an inhibition is started if the master flip-flop 1 operates in this region. Since subsequent flipping of the master flip-flop 1 from the unstable to the stable state, such as through a shortening of the output signal, can also lead to errors, an initiated inhibition must be maintained or stored until the next flank of the clock frequency $\emptyset_1$. This storage of the inhibition request must not take place in a separate flip-flop, since this flip-flop can again remain in an unstable state, but rather, it takes place as a third stable state of the master flip-flop 1 acting as a synchronization flip-flop during which its inputs are inhibited.

FIG. 2 shows the characteristics of the master flip-flop 1 to explain the terms "unwilling to make decisions" or metastable region, and the unstable point. The characteristic 26 of the gate 9 and the characteristic 27 of the gate 8 intersect at two "stable" points 22 and 23 and at an "unstable" point 24. The output voltage of the gate 9 and the input voltage of the gate 8 are designated with reference symbol $U_B$, wherein the input voltage of the gate 9 and the output voltage of the gate 8 are designated with reference symbol $U_A$. If both voltages $U_A$ and $U_B$ are identical, then the flip-flop 1 remains unstable; otherwise a stable point is reached after a certain amount of time. In FIG. 2, there are further shown:

$U_i$: unstable point of the output voltage;

$U_u$: lower trigger threshold voltage of the Schmitt-trigger gate 3;

$U_o$: upper trigger threshold voltage of the Schmitt-trigger gate 3; and $U_s$: threshold voltage of the slave flip-flop 2.

The size of the range 25 referred to as "unwilling to make decisions" which is shown with lines that are cross-hatched in FIG. 2 and is recognized by the circuit according to the invention, can be selected through the choice of the lower trigger threshold voltage $U_u$. The details of the operation of the circuit shown in FIG. 1 is as follows:

While the clock frequency $\emptyset_1$ is active ("high"), the asynchronous information is transferred into the master flip-flop 1 and an inhibit signal C present at the output of the Schmitt-trigger gate 3 is suppressed (C="low"). After the falling edge of the clock frequency $\emptyset_1$, data are no longer accepted by the flip-flop 1. If one of the voltages $U_A$ or $U_B$, present at the outputs A or B, is higher than the lower trigger threshold $U_u$ of the Schmitt-trigger gate 3, then the master flip-flop 1 operates in the "willing to make decisions" range; the inhibit signal C remains "low", and from the rising flank of the clock frequency $\emptyset_2$ on, the slave flip-flop 2 takes over the (stable) contents of the master flip-flop 1.

If, due to a critical condition, the master flip-flop 1 operates during the falling flank of the clock frequency $\emptyset_1$ in the range 25 which is "unwilling to make decisions" (see FIG. 2), then the Schmitt-trigger gate 3 responds (C="high") and inhibits both outputs of the master flip-flop 1 through the signal C. In this way the desired third stable state of the master flip-flop 1 is reached.

Since both signals present at the output A of the gate 8 and the output B of the gate 9 are now passive (low), the slave flip-flop 2 in the $\emptyset_2$ clock phase no longer accepts new data but continues to store the old content. This is permissible and does not lead to errors since metastable behavior occurs only if a edge of the input signal 20 and a synchronizing flank of the clock frequency $\emptyset_1$ coincide in time, and in this case, both states of the slave flip-flop 2 are possible, i.e. are permitted for the further processing.

With the use of the method according to the invention, synchronizing errors are therefore prevented. At the same time, optimum speed is obtained because of the elimination of the waiting time $t_s$ which is necessary in methods known from the state of the art.

A circuit constructed according to FIG. 1 can advantageously be provided in MOS technology. The construction of the circuit should be performed in such a manner that the lower trigger threshold voltage of the Schmitt-trigger gate 3, which is designated with reference symbol $U_u$ in FIG. 2 and in FIG. 3, which shows the characteristic of the Schmitt-trigger gate 3, is above the unstable point 24 of the master flip-flop 1. The threshold voltage of the slave flip-flop 2 must be above the upper trigger threshold voltage $U_c$ of the Schmitt-trigger gate 3. Advantageously, the master flip-flop 1 has a relatively large gain. In order to prevent a tendency to oscillate, the rising edges of the outputs A and B of the master flip-flop 1 should have a slower rise than the rising edge of the inhibit signal C. The third input of the Schmitt-trigger gate 3, which is addressed by the clock frequency $\emptyset_1$, must have no hysteresis, contrary to the inputs connected to the outputs A and B. However, the switching threshold thereof should be relatively high as compared to the switching threshold input AND gates 6 and 7.

There is claimed:

1. Method for the error-free synchronization of asynchronous pulses through logical interconnection of the asynchronous pulses with clock pulses of constant frequency by means of a flip-flop, which comprises comparing output voltages of the flip-flop with a predetermined threshold voltage for determining a metastable state of the flip-flop, and producing an inhibit signal therefrom and flipping the flip-flop into a third stable state by feeding back the inhibit signal during which its inputs are inhibited until the next clock pulse appears if a metastable state is present, for preventing an evaluation of the output voltages of the flip-flop.

2. Apparatus for carrying out a method for the error-free synchronization of asynchronous pulses, comprising a flip-flop being addressed by the asynchronous pulses, being controlled by clock pulses and having output gates, said output gates having inputs and outputs, said outputs of said output gates of said flip-flop supplying a synchronized signal, a Schmitt-trigger gate having inputs and an output, each input of said Schmitt-trigger gate being connected to a respective one of said outputs of said output gates of said flip-flop, and said output of said Schmitt-trigger gate being connected to said input side of said output gates of said flip-flop.

3. Apparatus according to claim 2, including a slave flip-flop connected to said outputs of said output gates of said first-mentioned flip-flop.

4. Apparatus according to claim 2, wherein said output gates of said flip-flop are NOR gates.

5. Apparatus according to claim 2, wherein said Schmitt-trigger gate has a further input being addressed by the clock pulses.

6. Apparatus according to claim 2, wherein said Schmitt-trigger gate is a NOR gate.

7. Apparatus according to claim 2, wherein said flip-flop has an unstable point, and said Schmitt-trigger gate has a lower threshold being above said unstable point.

8. Apparatus according to claim 3, wherein said Schmitt-trigger gate has an upper trigger threshold, and said slave flip-flop has a threshold voltage being above said upper trigger threshold.

* * * * *